United States Patent
Barnett et al.

[19]

[11] Patent Number: 5,831,784
[45] Date of Patent: Nov. 3, 1998

[54] PSEUDO DIFFERENTIAL VOLTAGE SENSE MR PREAMPLIFIER WITH IMPROVED BANDWIDTH

[75] Inventors: Raymond E. Barnett, Rosemount; Craig M. Brannon, Maplewood; Tuan V. Ngo, Eden Prairie, all of Minn.

[73] Assignee: VTC, Inc., Bloomington, Minn.

[21] Appl. No.: 709,345

[22] Filed: Sep. 5, 1996

[51] Int. Cl.$^6$ ............................... G11B 5/02; G11B 5/03
[52] U.S. Cl. ............................... 360/67; 360/66; 330/252
[58] Field of Search ................................... 360/66–68, 46; 330/250, 252, 260, 291

[56] References Cited

U.S. PATENT DOCUMENTS

| | | | |
|---|---|---|---|
| 5,204,789 | 4/1993 | Jove et al. | 360/67 |
| 5,270,882 | 12/1993 | Jove et al. | 360/66 |
| 5,371,479 | 12/1994 | Hagerty | 330/294 |
| 5,424,645 | 6/1995 | Doty | 324/318 |
| 5,426,542 | 6/1995 | Smith | 360/67 |
| 5,444,579 | 8/1995 | Klein et al. | 360/67 |
| 5,452,148 | 9/1995 | Kawai et al. | 360/67 |
| 5,548,453 | 8/1996 | Sasaki et al. | 360/67 |
| 5,633,765 | 5/1997 | Lin et al. | 360/46 |

Primary Examiner—Aristotelis M. Psitos
Assistant Examiner—Regina Y. Neal
Attorney, Agent, or Firm—Kinney & Lange, P.A.

[57] ABSTRACT

A preamplifier and its associated biasing circuitry for connection to a magnetoresistive sensor having a first end and a second end is disclosed. The biasing circuitry properly biases the preamplifier such that the preamplifier can properly read signals from the sensor. The preamplifier includes a first transistor. A base of the first transistor is connected to the first end of the magnetoresistive sensor. An emitter of the second transistor is connected to the emitter of the first transistor. A collector of the third transistor is connected to the collector of the first transistor. A base of the fourth transistor is connected to the second end of the magnetoresistive sensor, while the collector of the fourth transistor is connected to the collector of the second transistor, and the emitter of the fourth transistor is connected to the emitter of the third transistor. The preamplifier further includes a voltage source and a first and a second resistor. The first resistor is connected between the voltage source and the collector of the first and third transistors, while the second transistor is connected between the voltage source and the collectors of the second and fourth transistors. Finally, a first current source is connected between the emitters of the first and second transistors and ground, while a second current source is connected between the emitters of the third and fourth transistors and ground.

16 Claims, 3 Drawing Sheets

PSEUDO DIFFERENTIAL VOLTAGE SENSE MR PREAMPLIFIER WITH IMPROVED BANDWIDTH

BACKGROUND OF THE INVENTION

The present invention is a pseudo differential high impedance magnetoresistive preamplifier and associated biasing circuitry. More specifically, it is a magnetoresistive preamplifier and associated biasing circuitry which virtually eliminates the bandwidth dependance on parasitic inductance of a DC blocking capacitor and which also provides improved rejection of internal noise and common signals of the preamplifier.

There are presently two types of disc drive systems which write information to and read information from a magnetic storage medium, such as a disc. First, there is an inductive write, inductive read system. Second, there is an inductive write, magnetoresistive (MR) read system. It is the second category in which the present invention lies.

The front end of a disc drive system typically consists of a read/write transducer (recording head), an electronics module (containing the read preamplifier and the write driver), and interconnections between the various heads and the module. The module is placed close to the head to keep the interconnections as short as possible.

The present trend in the data storage industry is to increase aerial density on a magnetic storage medium at constant or even decreasing latencies. This results in magnetic storage mediums having narrower tracks, larger linear densities and higher data rates. While a single-element inductive read/write head has the attraction of simplicity, its applications are becoming outdated due to a non-adequate bandwidth. The bandwidth of a head directly affects the speed with which a head can read information from a magnetic storage medium. The larger the upper pole of the bandwidth, i.e., the point at which the gain of the head begins to roll off, the faster the head can read information from the magnetic storage medium.

In traditional inductive read/write heads, there is a severe conflict in choosing the ideal number of coil "turns" for read and write operations. Narrower track widths require a larger number of turns for reading. This makes the coil inductance increase quadratically. The resonance frequency of the coil inductance and the coil/wiring/electronics capacitance therefore decreases linearly. This reduces the useful data bandwidth rather than increasing it to accommodate a higher data rate. The use of a MR read element does not present this bandwidth restriction. It also allows separate optimization of the MR read element and the inductive write element, making possible write-wide, read-narrow strategies.

A preamplifier that senses a signal out of an MR sensor is fundamentally different than a preamplifier which senses a signal out of an inductive read sensor. The inductive read sensor has no DC bias across it so that a preamplifier can be directly coupled to it to sense the signal from DC frequencies up to the required upper bandwidth. An MR preamplifier, however, must have the ability to compensate for an inherent DC offset across the sensor which is required to properly bias the MR sensor, thereby producing a linear output signal. This bias is on the order of a few hundred milli-volts so that a high gain amplifier that amplifies DC signals cannot be directly connected to the sensor. If such a connection were made, the preamplifier would sense this offset and saturate the amplifier. Therefore, a preamplifier which is connected to an MR read sensor should pass an AC signal representing information from the magnetic storage medium, but not past a DC biasing signal.

Thus, there is a need for a preamplifier and its associated biasing circuitry which can be connected to an inductive write/MR read sensor which will properly pass an AC signal to an amplifier and associated external circuitry, but will not pass the DC signal necessary to bias the MR sensor. The preamplifier and associated biasing circuitry should accommodate a large bandwidth, while also providing rejection of internal noise and common signals of the preamplifier to ensure a clean output signal to the amplifier.

SUMMARY OF THE INVENTION

The present invention is a preamplifier and its associated biasing circuitry to be used with an inductive write, magnetoresistive read sensor. The biasing circuitry properly biases the preamplifier such that the preamplifier can properly read signals from the sensor. The preamplifier has a large bandwidth, while rejecting internal noise and common signals of the preamplifier. The preamplifier senses a signal from the magnetoresistive sensor and transmits the signal to further the circuitry such that a disc drive system can read information from a magnetic medium.

The preamplifier includes a first transistor having a base, a collector and an emitter. The base of the first transistor is connected to the first end of the magnetoresistive sensor. A second transistor having a base, a collector and an emitter is included such that the emitter of the second transistor is connected to the emitter of the first transistor. The preamplifier further includes a third transistor having a base, a collector and an emitter, the collector of the third transistor is connected to the collector of the first transistor. A fourth transistor having a base, a collector and an emitter is also included such that the base of the fourth transistor is connected to the second end of the magnetoresistive sensor, while the collector of the fourth transistor is connected to the collector of the second transistor, and the emitter of the fourth transistor is connected to the emitter of the third transistor.

The preamplifier further includes a voltage source and first and second resistors. The first resistor is connected between the voltage source and the collector of the first and third transistors. While the second transistor is connected between the voltage source and the collectors of the second and fourth transistors. Finally, a first current source is connected between the emitters of the first and second transistors and ground, while a second current source is connected between the emitters of the third and fourth transistors and ground.

The biasing circuitry includes several operational transconductance amplifiers (OTAs) comprising numerous transistors and diodes. The OTAs force the voltage at the base of the second transistor of the preamplifier to be equal to the voltage at the base of the first transistor of the amplifier. Likewise, the biasing circuitry ensures that the voltage at the base of the fourth transistor of the preamplifier is equal to the voltage at the base of the third transistor of the amplifier. By maintaining the voltages at the bases of the first through fourth transistors, the biasing circuitry ensures that the preamplifier is properly biased such that it can sense information from the magnetoresistive sensor and pass a signal representing the information to an amplifier and external circuitry.

DETAILED DESCRIPTION OF THE PREFERRED EMBODIMENTS

The present invention is a preamplifier and its associated biasing circuitry for use with an inductive write, magnetoresistive (MR) read sensor. In the past, inductive write, inductive read disc drive systems were used to write information to and read information from a magnetic storage medium. However, the present trend in the data storage industry is to increase aerial density at constant or even decreasing latencies. This results in magnetic storage mediums having narrower tracks, larger linear densities and higher data rates. While a single-element inductive read/write head has the attraction of simplicity, its applications have become outdated due to a non-adequate bandwidth. This non-adequate bandwidth prevents a disc drive from reading information from a magnetic storage medium at necessary high rates.

The preamplifier and associated biasing circuitry of the present invention properly passes an AC signal representing information from the magnetic storage medium to external circuitry while preventing a DC biasing signal from passing to the external circuitry. The DC signal is necessary to bias the MR read sensor. The preamplifier and its associated biasing circuitry accommodates a larger bandwidth, while also providing rejection of internal noise and common signals of the preamplifier.

Figure 1:
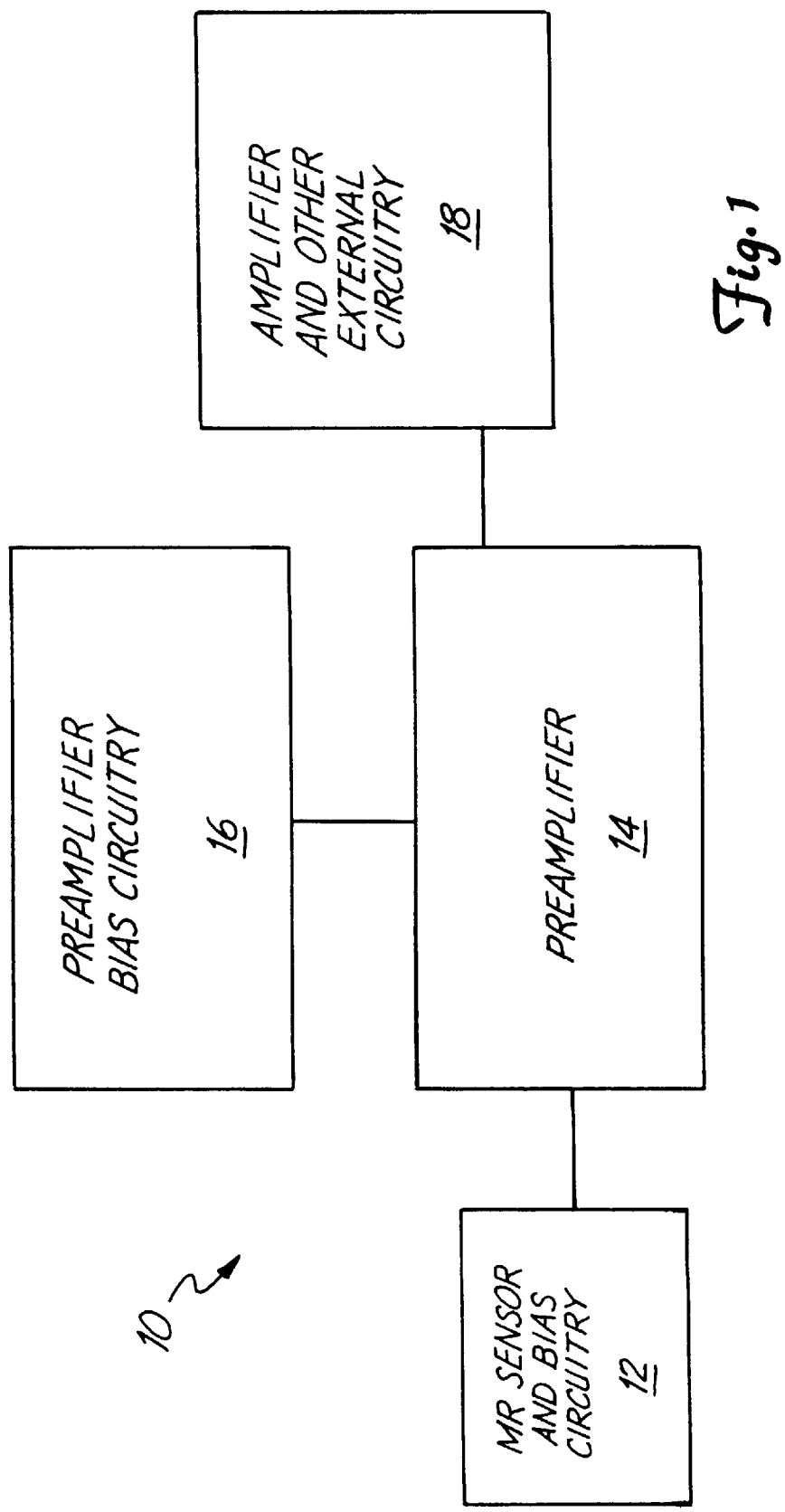
FIG. 1 is a block diagram of a read portion of a disc drive system for use with a magnetoresistive read head.

FIG. 1 is a block diagram of disc drive circuitry 10 which includes MR sensor and biasing circuitry 12, preamplifier 14, preamplifier bias circuitry 16 and amplifier and other external circuitry 18.

The block diagram of FIG. 1 represent the basic elements necessary for the read portion of an inductive write, MR read disc drive system. The MR sensor of MR sensor and biasing circuitry 12 senses (i.e. reads) signals from a magnetic storage medium, such as a disc. In order for the MR sensor of MR sensor and biasing circuitry 12 to properly sense a signal from a magnetic storage medium and to produce a linear signal out of the MR sensor, biasing circuitry of MR sensor and biasing circuitry 12 must produce a DC offset across the sensor. This bias is in the range of 50 to 100 millivolts.

Preamplifier bias circuitry 16 is necessary to properly bias preamplifier 14. Preamplifier bias circuitry 16 includes circuitry which properly biases preamplifier 14 such that it can receive a signal from the MR sensor of MR sensor and bias circuitry 12 and convert the signal into a signal which can be properly amplified and manipulated by amplifier and other external circuitry 18.

There are two types of sensing circuitry that can be used to sense and amplify the signal from the MR sensor of MR sensor and bias circuitry 12; voltage sensor circuitry (high input impedance amplifier) and current sense circuitry (low input impedance amplifier). The MR sensor is a low impedance element on the order of 5 to 50 ohms. Thus, a current sense scheme is better suited to amplify the signal over a wide bandwidth in the presence of typical parasitic elements (i.e. series inductances) that are inherent in the connection of the sensor to the preamplifier.

Figure 2:
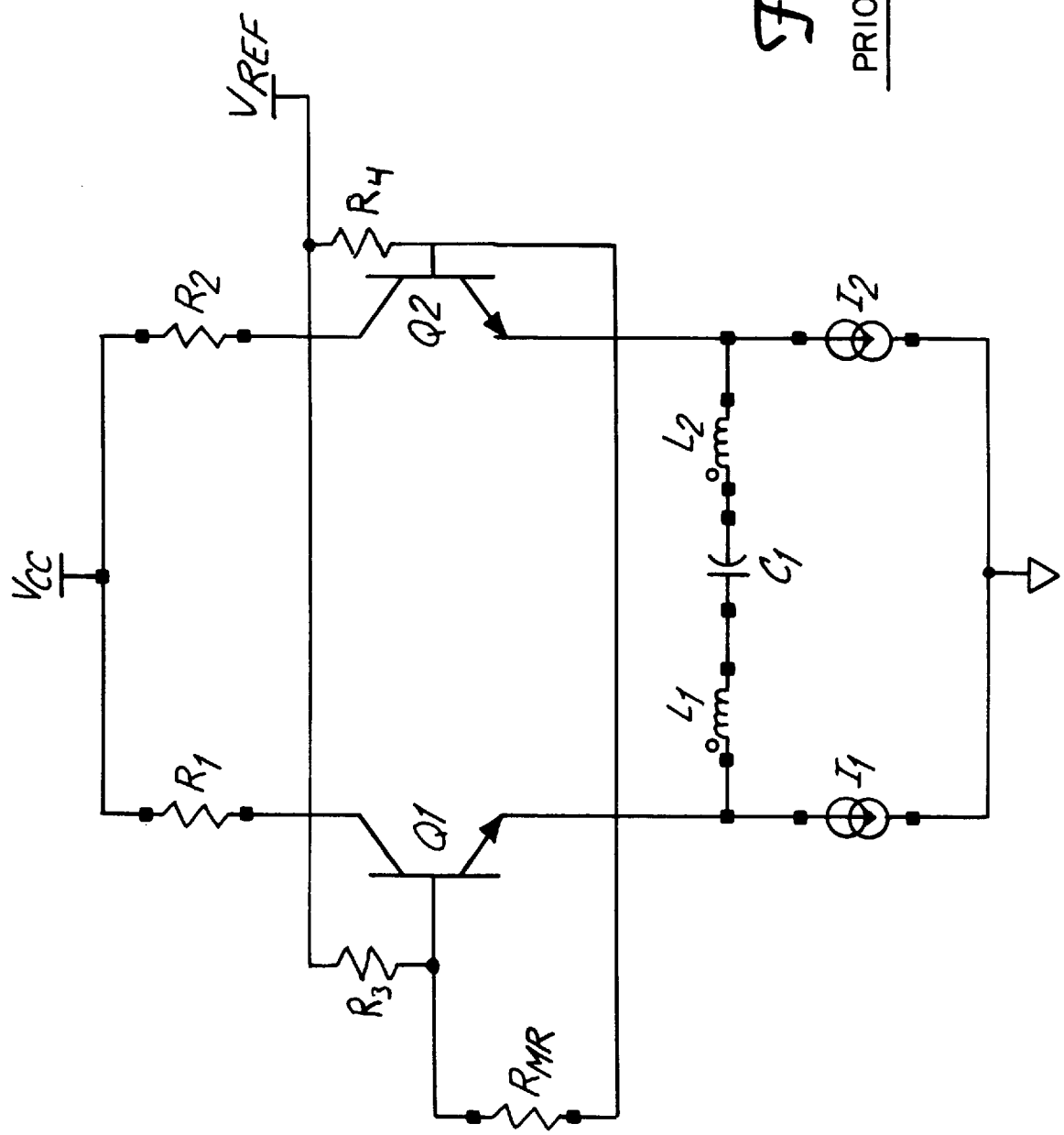
FIG. 2 is a circuit diagram of a prior art preamplifier used in the system shown in FIG. 1.

FIG. 2 is a prior art preamplifier incorporating a current sensing scheme. The preamplifier of FIG. 2 includes voltage source $V_{CC}$, reference voltage $V_{REF}$, resistors $R_1$, $R_2$, $R_3$ and $R_4$, magnetoresistive sensor represented by resistor $R_{MR}$, transistors $Q_1$, and $Q_2$, capacitor $C_1$ with its internal parasitic inductance shown as $L_1$ and $L_2$ and current sources $I_1$, $I_2$ and $I_{MR}$. The biasing circuitry used to bias magnetoresistive sensor $R_{MR}$ is not shown for simplicity sake. In addition, the biasing circuitry necessary to bias preamplifier 20 is not shown.

The prior art preamplifier utilizes capacitor $C_1$ to couple the emitters of transistors $Q_1$ and $Q_2$ to form a pseudo differential pair. This differential pair senses the signal out of MR sensor $R_{MR}$. The architecture shown in FIG. 2 is not well suited for a wide bandwidth because the internal parasitic inductance associated with the capacitor, represented by $L_1$ and $L_2$, causes the gain of the preamplifier to prematurely roll off as the frequency increases. An upper bandwidth pole (i.e., 3-dB point) is created from the resistance and the parasitic inductances of the circuit. However, since the capacitive element of this circuit is effectively shortened out by the low input impedance of the circuit, it can be neglected in analyzing the electrical behavior of the circuitry, leaving only the resistive and inductive elements to be considered. The sensed signal is effectively in series with the resistive and inductive elements of the circuit. Since the impedance of an inductor increases with an increasing frequency, the parasitic resistance and inductance form a low-pass filter. This filtering action limits the useful bandwidth of the circuit. The pole, or the 3-dB upper cutoff frequency, is determined by the equation:

$$F_{-3db} = \frac{R}{2\pi(L_1 + L_2)}.$$

For typical values of 10 nanoHenries of stray inductance and a 4 ohm of resistance, the cutoff frequency is about 64 MHz, which is not suitable for a high band disc drive system.

As shown by the above equation, the bandwidth is severely limited by the internal parasitic inductance represented by $L_1$ and $L_2$ of the DC blocking capacitor. Another disadvantage of this prior art circuitry is the injection of noise from current sources $I_1$ and $I_2$ at high frequencies. Any noise common to current sources $I_1$ and $I_2$ is common mode rejected at low and medium frequencies. However, at higher frequencies, the internal parasitic inductance $L_1$ and $L_2$ causes the noise to split differently between transistors $Q_1$ and $Q_2$ so that common mode rejection is destroyed. Since good current source design is critical for the prior architecture, an off chip capacitor is usually required in the circuit of FIG. 2 to shunt out high frequency noise. However, the use of an off chip capacitor is cost prohibitive, and therefore not desired.

Figure 3:
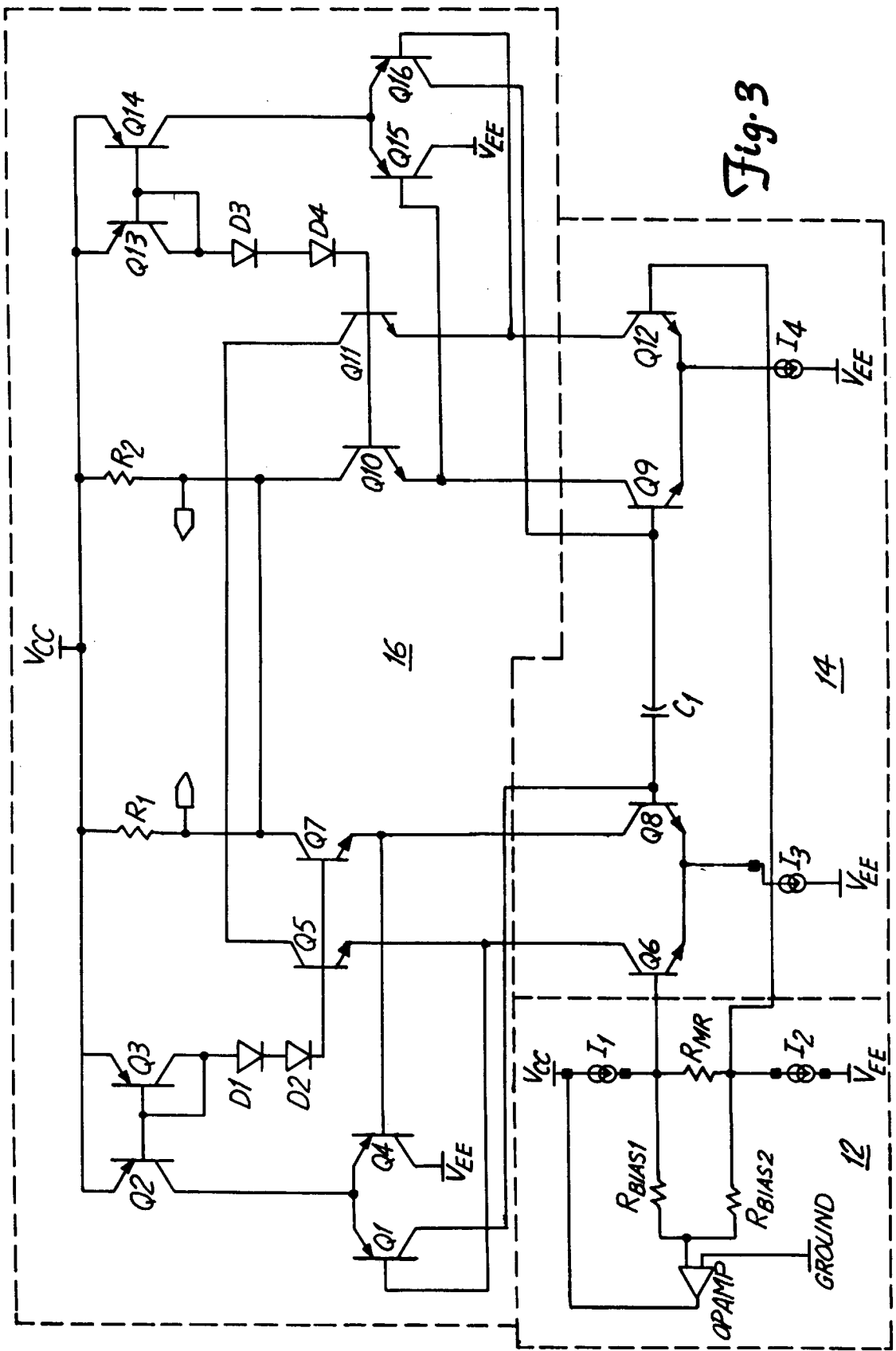
FIG. 3 is a circuit diagram of a read portion of a disc drive system incorporating the present invention.

FIG. 3 is a circuit diagram of MR sensor and bias circuitry 12, preamplifier 14 and preamplifier bias circuitry 16 incorporating the present invention. MR sensor and bias circuitry 12 includes voltage source $V_{CC}$, current sources $I_1$ and $I_2$, MR sensor $R_{MR}$, bias resistors $R_{BIAS1}$ and $R_{BIAS2}$ and operational amplifier OPAMP. Preamplifier bias circuitry 16 includes voltage source $V_{CC}$, transistors $Q_1$–$Q_5$, $Q_7$, $Q_{10}$, $Q_{11}$ and $Q_{13}$–$Q_{16}$, diodes $D_1$–$D_4$, resistors $R_1$ and $R_2$, and voltage source $V_{EE}$. Preamplifier 14 includes capacitor $C_1$ with its internal parasitic inductance, transistors $Q_6$, $Q_8$, $Q_9$ and $Q_{12}$, voltage source $V_{EE}$ and current sources $I_3$ and $I_4$.

MR sensor $R_{MR}$ has a resistance in the range of 1 to 100 ohms, and preferably in the range of 10 to 40 ohms. Resistors $R_1$ and $R_2$ have a resistance in the range of 25 to 1,000 ohms, and preferably in the range of 100 to 500 ohms. Capacitor $C_1$ has a capacitance in the range of 50 to 1,500 picoFarrads, and preferably in the range of 200 to 1,000 picoFarrads. Current sources $I_3$ and $I_4$ have a current in the range of 1 to 50 milliAmperes, and preferably in the range of 10 to 20 milliAmperes. Capacitor $C_1$ also has an internal parasitic inductance in the range of 5 to 50 nanoHenries, and preferably in the range of 10 to 20 nanoHenries.

The bias circuitry shown in MR sensor and bias circuitry 12 is one example of circuitry which can be used to bias MR sensor $R_{MR}$. However, it is understood that other bias circuitry for biasing magnetoresistive sensor $R_{MR}$ can be used. It is only necessary that the bias circuitry properly biases magnetoresistive sensor $R_{MR}$ such that there is a DC offset across the sensor which permits MR sensor $R_{MR}$ to produce a linear output signal. Resistors $R_{BIAS1}$ and $R_{BIAS2}$ have a resistance in the range of 0.5K to 15K ohms, while voltage source $V_{CC}$ has a voltage in the range of 2 to 15 volts. Thus, current sources $I_1$ and $I_2$ have a current in the range of 2 to 25 milliamperes. Using the aforementioned values, a typical value of the bias across MR sensor $R_{MR}$ is in the range of 25 to 750 millivolts.

As shown in FIG. 3, preamplifier 14 incorporates circuitry which is substantially different from the circuitry shown in prior art preamplifier 20 of FIG. 2. The current sensing MR input scheme as shown in FIG. 3 provides for a bandwidth which is less dependent on the internal parasitic inductance associated with DC blocking capacitor $C_1$. Transistors $Q_6$, $Q_8$ and $Q_9$, $Q_{12}$ are differential pairs, respectively, that are used to detect the differential voltage across MR sensor $R_{MR}$, but not to pass a DC biasing voltage used to bias MR sensor $R_{MR}$ to amplifier 18 (shown in FIG. 1). The gain of preamplifier 14 is set by grounding the emitters of differential pairs $Q_6$, $Q_8$ and $Q_9$, $Q_{12}$ instead of an AC couple provided by a capacitor in the prior art scheme.

In the present scheme, blocking capacitor $C_1$ is at a high impedance point so that the internal parasitic inductance associated with capacitor $C_1$ do not effect the gain as in the prior art scheme. In addition, since capacitor $C_1$ is at a high impedance point, its value is much smaller than capacitor $C_1$ in the prior art.

One effect of utilizing the circuitry shown in FIG. 3 is that the noise of preamplifier 14 increases by the square root of two for the same bias current and device size as in the prior art scheme shown in FIG. 2. The noise can be equalized to the prior art scheme by doubling the bias current and the device sizes of transistors $Q_6$, $Q_8$, $Q_9$ and $Q_{12}$. The upper bandwidth cutoff point is now limited to the resonance of the internal parasitic inductance and the capacitance of the preamplifier, and is given by the equation:

$$F_{-3dB} = \frac{1}{2\pi\sqrt{LC}}.$$

A typical value of capacitance $C_1$ is 10 picoFarrads and a typical value of the internal parasitic inductance is 10 nanoHenries. Using these numbers, the upper bandwidth cutoff point is 500 MHz. This is a substantial improvement over the prior art. In addition, noise from current sources $I_1$ and $I_2$ are better rejected than in the prior art because the internal parasitic inductance is taken out of the main signal path and the noise of the preamplifier comes through differentially to both sides and is common mode rejected, regardless of the frequency.

Preamplifier bias circuitry 16 is shown in FIG. 3. Preamplifier bias circuitry 16 properly biases preamplifier 14. More specifically, preamplifier bias circuitry 16 properly biases transistors $Q_6$, $Q_8$, $Q_9$ and $Q_{12}$ of preamplifier 14. If transistors $Q_6$, $Q_8$, $Q_9$ and $Q_{12}$ are not properly biased, signals from the magnetic storage medium will not be properly read.

As shown in FIG. 3, preamplifier bias circuitry 16 can be broken down into two identical circuits. One circuit, which includes resistor $R_1$, transistors $Q_1$–$Q_4$, $Q_5$ and $Q_7$ and diodes $D_1$ and $D_2$ provide the bias circuitry for transistors $Q_6$ and $Q_8$ of preamplifier 14, while transistors $Q_{10}$, $Q_{11}$ and $Q_{13}$–$Q_{16}$, resistor $R_2$ and diodes $D_3$ and $D_4$ properly bias transistors $Q_9$ and $Q_{12}$ of preamplifier 14. Both circuits are a modified form of an operational transconductance amplifier (OTA). While the biasing circuitry which biases transistors $Q_6$ and $Q_8$ will further be discussed, it is understood that the biasing circuitry which biases transistors $Q_9$ and $Q_{12}$ is substantially the same.

An OTA is a voltage-input, current-output device such that:

$$I_o = g_M V_I$$

where $g_M$ is the transconductance, or gain of the OTA. What makes OTAs unique is the ability to vary the gain over a wide dynamic range by means of an external control current. $I_C$, $$g_M = K I_C$$

where K is a suitable scale factor having the dimensions of $V^{-1}$. In this respect, the OTA is a wide dynamic range 2-quadrant multiplier whose output current is proportional to the product of bipolar input voltage $V_1$ and unipolar control current $I_C$. The heart of an OTA is the linearlized transconductance multiplier and current mirrors of the Wilson type. The Wilson type provides better current matching and higher output impedance.

The purpose of preamplifier biasing circuitry 16 is to ensure that the voltages at the bases of $Q_6$ and $Q_8$ are identical, thereby properly biasing transistors $Q_6$ and $Q_8$ to maintain a differential system. To do this, preamplifier biasing circuitry 16 ensures that the current to the base of transistor $Q_8$ is equal to the current at the base of transistor $Q_6$. The current at the base of transistor $Q_6$ is provided by the current from MR sensor $R_{MR}$, while the current at the base of transistor $Q_8$ is provided by a feedback loop.

As shown in FIG. 3, transistors $Q_5$ and $Q_7$ are the cascode of transistors $Q_6$ and $Q_8$. Thus, the base current of $Q_5$ should equal the base current of $Q_6$ and the base current of $Q_7$ should equal the base current of $Q_8$. The base currents of $Q_5$ and $Q_7$ are driven through diodes $D_1$ and $D_2$ into the base of transistors $Q_2$ and $Q_3$. This current is also fed into the emitter of $Q_3$. The gain ratio between transistors $Q_2$ and $Q_3$ is a one to two ratio, respectively. This ratio is necessary since twice the base current at the base of transistor $Q_6$ is supplied to the bases of transistors $Q_2$ and $Q_3$. In the present design, it is necessary to have a current equal to the base current of transistor $Q_6$ fed to the base of transistor $Q_8$.

The collector of transistors $Q_2$ and $Q_3$ are tied to voltage source $V_{CC}$. The emitter current of transistor $Q_2$ is fed into the collector of transistors $Q_1$ and $Q_4$. The emitter current of transistor $Q_1$ is then fed back to the base of transistor $Q_8$ via transistor pair $Q_1$ and $Q_4$. Thus, with the present design, the current at the base of $Q_8$ is forced to be equal to the current at the base of transistor $Q_6$. Once again, the circuitry used to bias transistors $Q_9$ and $Q_{12}$ is identical to that of transistors $Q_6$ and $Q_8$.

Although the present invention has been described with reference to preferred embodiments, workers skilled in the art will recognize that changes may be made in form and detail without departing from the spirit and scope of the invention.

What is claimed is:

1. A preamplifier for connection to a magnetoresistive sensor having a first end and a second end, for sensing a signal from the magnetoresistive sensor, the preamplifier comprising:

a first transistor having a base, a collector, and an emitter, the base of the first transistor connected to the first end of the magnetoresistive sensor; a second transistor having a base, a collector, and an emitter, the emitter of the second transistor connected to the emitter of the first transistor;

a third transistor having a base, a collector, and an emitter;

a fourth transistor having a base, a collector, and an emitter, the base of the fourth transistor connected to the second end of the magnetoresistive sensor, the collector of the fourth transistor connected to the collector of the first transistor and the emitter of the fourth transistor connected to the emitter of the third transistor;

a first resistor connected between a voltage source and the collectors of the second and third transistors;

a second resistor connected between the voltage source and the collectors of the second and third transistors;

a capacitor connected between the bases of the second and third transistors;

a first current source connected between the emitters of the first and second transistors and ground; and a second current source connected between the emitters of the third and fourth transistors and ground.

2. The preamplifier of claim 1 wherein the magnetoresistive sensor has a resistance in the range of 1 to 100 ohms.

3. The preamplifier of claim 1 wherein the magnetoresistive sensor has a resistance in the range of 10 to 40 ohms.

4. The preamplifier of claim 1 wherein the first and second resistors have a resistance in the range of 25 to 1,000 ohms.

5. The preamplifier of claim 1 wherein the first and second resistors have a resistance in the range of 100 to 500 ohms.

6. The preamplifier of claim 1 wherein the capacitor has a capacitance in the range of 50 to 1,500 picoFarrads.

7. The preamplifier of claim 1 wherein the capacitor has a capacitance in the range of 200 to 1,000 picoFarrads.

8. The preamplifier of claim 1 wherein the first and second current sources have a current in the range of 1 to 50 milliAmperes.

9. The preamplifier of claim 1 wherein the first and second current sources have a current in the range of 10 to 20 milliAmperes.

10. The preamplifier of claim 1 wherein the capacitor has a parasitic inductance in the range of 5 to 50 nanoHenries.

11. The preamplifier of claim 1 wherein the capacitor has a parasitic inductance in the range of 10 to 20 nanoHenries.

12. The preamplifier of claim 1 wherein a magnetoresistive sensor bias current is connected to the magnetoresistive sensor to bias the magnetoresistive sensor.

13. A preamplifier bias circuit for biasing a preamplifier, the preamplifier having an emitter of a first transistor connected to an emitter of a second transistor, and having an emitter of a third transistor connected to an emitter of a fourth transistor, and having a capacitor separating a base of the second transistor from a base of the third transistor, the preamplifier bias circuit comprising:

a first operational transconductance amplifier connected to a collector of the first transistor and a collector of the second transistor, the first operational transconductance amplifier forcing a current at a base of the second transistor to be substantially equal to a current at a base of the first transistor, thereby ensuring that a voltage at the base of the second transistor is substantially equal to the voltage at the base of the first transistor; and a second operational transconductance amplifier connected to a collector of the third transistor and a collector of the fourth transistor, the second operational transconductance amplifier forcing a current at a base of the fourth transistor to be substantially equal to a current at a base of the third transistor, thereby ensuring that a voltage at the base of the fourth transistor is substantially equal to the voltage at the base of the third transistor.

14. The preamplifier bias circuit of claim 13 wherein the first operational transconductance amplifier includes:

a first voltage source;

a second voltage source;

a fifth transistor having a collector, an emitter and a base, the emitter connected to a collector of the first transistor of the preamplifier and the collector connected to the second operational transconductance amplifier;

a sixth transistor having a collector, an emitter and a base, the emitter connected to a collector of the second transistor of the preamplifier, the base of the sixth transistor connected to the base of the fifth transistor and the collector connected to the second operational transconductance amplifier, wherein the fifth and sixth transistors are a cascode of the first and second transistors;

a first resistor connected between the first voltage source and the collector of the sixth transistor;

a first diode having an anode and a cathode, the cathode connected to the base of the fifth and sixth transistors;

a second diode having an anode and a cathode, the cathode connected to the anode of the first diode;

a seventh transistor having a collector, an emitter, and a base, the emitter connected to the first voltage source, the collector connected to the anode of the second diode and to the base of the seventh transistor;

an eighth transistor having a collector, an emitter, and a base, the emitter connected to the first voltage source, the base connected to the base and the collector of the seventh transistor, wherein the seventh and eighth transistor form a transistor pair;

a ninth transistor having a collector, an emitter, and a base, the emitter connected to the collector of the eighth transistor, the base connected to the emitter of the fifth transistor and collector of the first transistor, and the collector connected to the base of the second transistor; and a tenth transistor having a collector, an emitter, and a base, the emitter connected to the emitter of the ninth transistor and the collector of the eighth transistor, the collector connected to the second voltage source, and the base connected to the emitter of the sixth transistor and the collector of the second transistor.

15. The preamplifier bias circuitry of claim 14 wherein the second operational transconductance amplifier further comprising:

an eleventh transistor having a collector, an emitter and a base, the emitter connected to a collector of the third transistor of the preamplifier and the collector connected to the first operational transconductance amplifier;

a twelfth transistor having a collector, an emitter and a base, the emitter connected to a collector of the fourth transistor of the preamplifier, the base of the twelfth transistor connected to the base of the eleventh transistor and the collector connected to the second operational transconductance amplifier, wherein the eleventh and twelfth transistors are a cascode of the third and fourth transistors;

a second resistor connected between the first voltage source and the collector of the eleventh transistor;

a third diode having an anode and a cathode, the cathode connected to the base of the eleventh and twelfth transistors;

a fourth diode having an anode and a cathode, the cathode connected to the anode of the first diode;

a thirteenth transistor having a collector, an emitter, and a base, the emitter connected to the first voltage source, the collector connected to the anode of the second diode and to the base of the thirteenth transistor;

a fourteenth transistor having a collector, an emitter, and a base, the emitter connected to the first voltage source, the base connected to the base and the collector of the thirteenth transistor, wherein the thirteenth and fourteenth transistor form a transistor pair;

a fifteenth transistor having a collector, an emitter, and a base, the emitter connected to the collector of the fourteenth transistor, the base connected to the emitter of the eleventh transistor and collector of the third transistor, and the collector connected to the second voltage source; and an sixteenth transistor having a collector, an emitter, and a base, the emitter connected to the emitter of the fifteenth transistor and the collector of the fourteenth transistor, the collector connected to the base of the third transistor, and the base connected to the collector of the fourth transistor and the emitter of the twelfth transistor.

16. A circuit for connection to a magnetoresistive sensor having a first end and a second end for sensing a signal from the magnetoresistive sensor, the circuit comprising:

a first transistor having a base, a collector, and an emitter, the base of the first transistor connected to the first end of the magnetoresistive sensor;

a second transistor having a base, a collector, and an emitter, the emitter of the second transistor connected to the emitter of the first transistor;

a third transistor having a base, a collector, and an emitter;

a fourth transistor having a base, a collector, and an emitter, the base of the fourth transistor connected to the second end of the magnetoresistive sensor, the collector of the fourth transistor connected to the collector of the first transistor and the emitter of the fourth transistor connected to the emitter of the third transistor;

a first resistor connected between a voltage source and the collectors of the second and third transistors;

a second resistor connected between the a voltage source and the collectors of the second and third transistors;

a capacitor connected between the bases of the second and third transistors;

a first current source connected between the emitters of the first and second transistors and ground;

a second current source connected between the emitters of the third and fourth transistors and ground;

a first operational transconductance amplifier connected to the first and second transistors, the first operational transconductance amplifier forcing a current at a base of the second transistor to be substantially equal to a current at a base of the first transistor, thereby ensuring that a voltage at the base of the second transistor is substantially equal to the voltage at the base of the first transistor; and a second operational transconductance amplifier connected to the third and fourth transistors, the second operational transconductance amplifier forcing a current at a base of the fourth transistor to be substantially equal to a current at a base of the third transistor, thereby ensuring that a voltage at the base of the fourth transistor is substantially equal to the voltage at the base of the third transistor.

* * * * *